(12) United States Patent
Kakkad

(10) Patent No.: US 7,670,886 B2
(45) Date of Patent: Mar. 2, 2010

(54) METHOD FOR FABRICATING POLYSILICON FILM

(75) Inventor: Ramesh Kakkad, Chu-Nan (TW)

(73) Assignee: TPO Displays Corp. (TW)

(*) Notice: Subject to any disclaimer, the term of this patent is extended or adjusted under 35 U.S.C. 154(b) by 541 days.

(21) Appl. No.: 11/472,858

(22) Filed: Jun. 22, 2006

(65) Prior Publication Data
US 2007/0298595 A1 Dec. 27, 2007

(51) Int. Cl.
*H01L 21/00* (2006.01)
(52) U.S. Cl. .................... 438/151; 438/795
(58) Field of Classification Search .............. 438/151, 438/795
See application file for complete search history.

(56) References Cited

U.S. PATENT DOCUMENTS

| | | | |
|---|---|---|---|
| 6,703,266 B1 | 3/2004 | Chen et al. | |
| 6,731,352 B2 | 5/2004 | Shih et al. | |
| 6,740,569 B2 | 5/2004 | Shih et al. | |
| 6,759,350 B2 | 7/2004 | Tsai | |
| 6,787,405 B2 | 9/2004 | Chen | |
| 6,847,414 B2 | 1/2005 | Chen | |
| 6,869,834 B2 | 3/2005 | Lin | |
| 6,924,874 B2 | 8/2005 | Lin et al. | |
| 2006/0121742 A1* | 6/2006 | Metz et al. | 438/778 |
| 2007/0048915 A1* | 3/2007 | Ting | 438/166 |
| 2007/0077735 A1* | 4/2007 | Peng et al. | 438/486 |

FOREIGN PATENT DOCUMENTS

JP 11354444 12/1999

* cited by examiner

*Primary Examiner*—Bradley K Smith
(74) *Attorney, Agent, or Firm*—Thomas, Kayden, Horstemeyer & Risley, LLP.

(57) ABSTRACT

A method of fabricating a polysilicon film includes: forming a seed layer on a surface of a substrate; forming a silicon layer over the surface of the seed layer; and performing a laser annealing process to transform the silicon layer into a polysilicon layer at a laser energy equal to or greater than that needed to cause complete melting of the silicon layer.

16 Claims, 7 Drawing Sheets

METHOD FOR FABRICATING POLYSILICON FILM

BACKGROUND OF THE INVENTION

1. Field of the Invention

The present invention relates to a method of fabricating polysilicon films.

2. Description of the Prior Art

Currently, liquid crystal displays (LCDs) are the most popular flat panel display technology. The applications for liquid crystal displays are extensive, such as mobile phones, digital cameras, video cameras, notebooks, and monitors. Due to high quality display requirements and the expansion of new application fields, the LCDs has developed toward a direction of high quality, high resolution, high brightness, and low price. Development of low temperature polysilicon thin film transistors (LTPS TFTs), to be used in active matrix LCD, is a break-through in achieving the above objectives.

Figure 1:
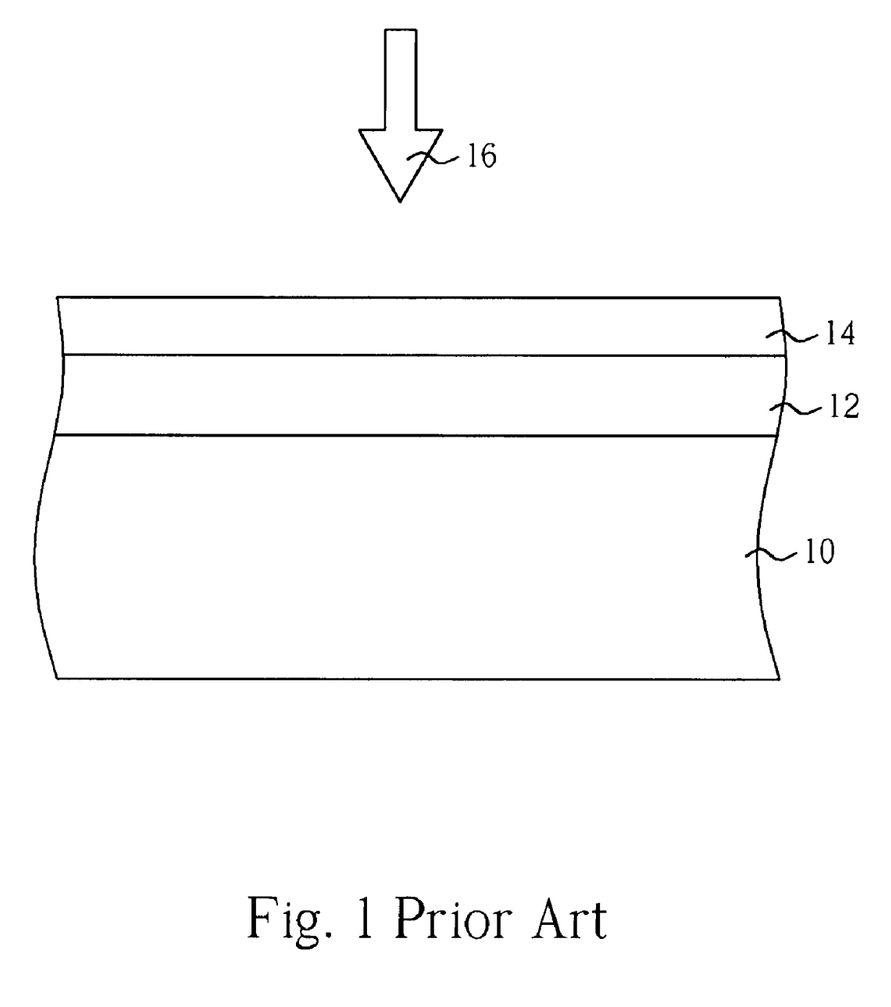
FIG. 1 is a perspective diagram showing the means of fabricating a low temperature polysilicon film according to the prior art.

With reference to FIG. 1, FIG. 1 is a perspective diagram showing the means of fabricating a low temperature polysilicon film according to the prior art. As shown in FIG. 1, a substrate 10 is provided, in which the substrate 10 is composed of transparent material such as glass. Next, a barrier layer 12 composed of silicon oxide ($SiO_2$) or silicon nitride (SiN) is disposed on the substrate 10, in which the barrier layer 12 is amorphous in nature. Next, an amorphous silicon (a-Si) layer 14 is placed on the barrier layer 12, and a laser annealing process 16 is performed to utilize an excimer laser to irradiate the amorphous silicon layer 14 and cause a crystallization of the amorphous silicon layer 14.

During crystallization, the amorphous silicon layer 14 will undergo a melting and re-growth transition and transform into a polysilicon layer. The grain size of the resulting polysilicon is dependent upon the energy of the laser annealing process, such that the polysilicon grain size increases with laser energy density up to an energy level lower than that required to completely melt the silicon layer, an energy level referred to as "full-melt threshold". After the laser energy reaches the full-melt threshold or surpasses the full-melt threshold, the grain size of the polysilicon layer will become small again, resulting in microcrystalline forms. Essentially, this phenomenon is caused by the fact that no nuclei will survive at the full-melt threshold as the amorphous silicon layer 14 grows on the amorphous barrier layer 12, and during the cooling stage, many nuclei will be formed resulting into many small grains. Hence, in order to maximize the size and uniformity of the grains, the optimum laser energy value for the crystallization process should be maintained just below the full-melt threshold value. Typically, the optimum laser energy range, also referred to as the "process window", is of the order of 10 mJ/cm2. Ultimately, the small process window of the conventional method leads to non-uniformity and non-reproducibility of silicon crystal quality due to spatial and run-to-run variations of laser beam energy, which may eventually be larger than the process window.

Additionally, the full-melt threshold is dependent upon the thickness of the silicon layer. Hence, spatial and run-to-run variation in silicon thickness will also result in non-uniformity of the crystal quality. Another disadvantage of the prior art is that each region of the amorphous silicon layer must be irradiated with large number of pulses (often referred to as the number of shots) to obtain uniform grain size. In most cases, a region is irradiated 20 to 40 times before achieving satisfactory and uniform grain size and the frequent irradiation performed will ultimately reduces the throughput of the laser annealing process.

SUMMARY OF THE INVENTION

A method of utilizing a seed layer and adjusting the energy level of the laser annealing process for fabricating a polysilicon film with optimum uniformity is provided.

An embodiment of such a method of fabricating polysilicon films includes the following steps: forming a seed layer on a surface of a substrate; forming a silicon layer over the surface of the seed layer; and performing a laser annealing process to transform the silicon layer into a polysilicon layer at laser energy equal to or greater than that needed to cause complete melting of the silicon layer.

By placing an additional seed layer between the barrier layer and the amorphous silicon layer, in which the seed layer is lattice-matched to the polysilicon layer, some embodiments of the present invention is able to increase the optimum laser energy range, also referred to as the process window for crystallization of silicon, reduce the number of laser shots required for uniform silicon thereby leading to increased throughput and reduced fabrication cost, and improve the crystallinity of the resulting polysilicon film thereby enhancing the thin film transistor performance.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
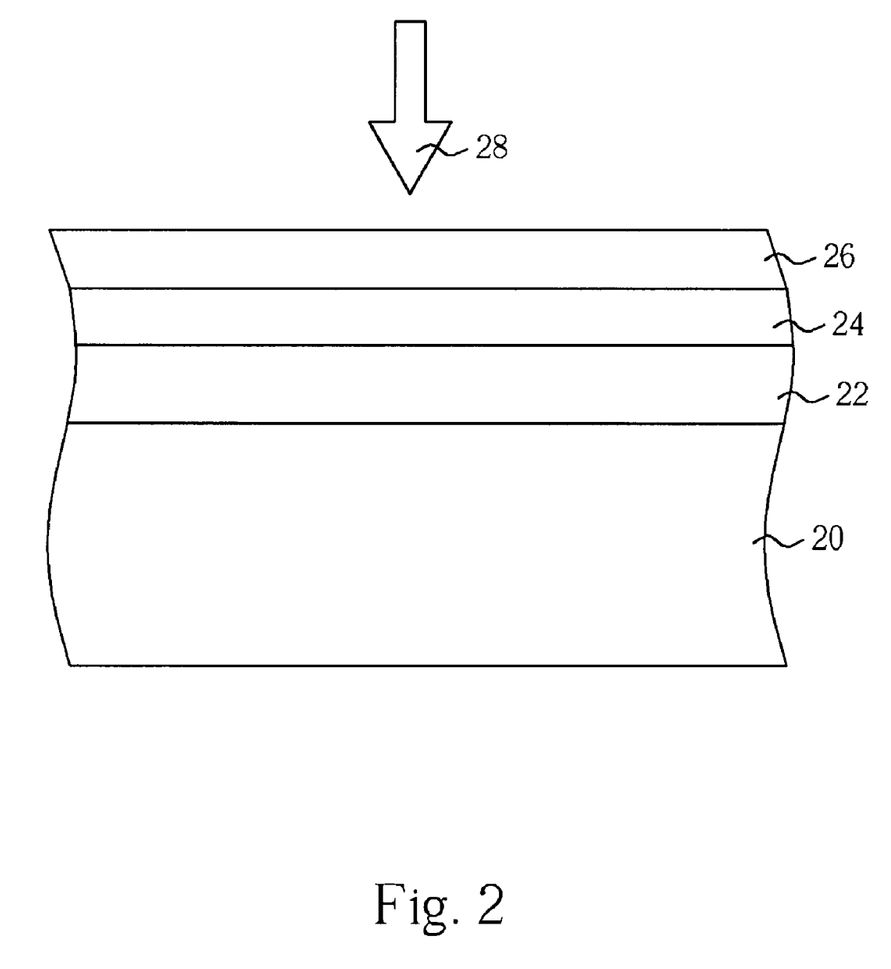
FIG. 2 is a perspective diagram showing the means of fabricating a polysilicon film according to an embodiment of the present invention.

Referring to FIG. 2, FIG. 2 is a perspective diagram showing the means of fabricating a polysilicon film according to an embodiment of the present invention. As shown in FIG. 2, a transparent substrate 20 is first provided, in which the transparent substrate 20 is composed of glass. Next, an amorphous barrier layer 22 composed of silicon oxide or silicon nitride is formed on the transparent substrate 20. Next, a sputtering, atomic layer deposition (ALD), evaporation, or chemical vapor deposition (CVD) process is performed to form a seed layer 24 having a crystal structure on the barrier layer 22. Next, another chemical vapor deposition or sputtering process is performed to deposit an amorphous silicon layer 26 on the seed layer 24.

The seed layer 24 can be approximately 500 to 5000 angstroms in thickness. The seed layer 24 can have crystallinity and comprises a crystal structure. Thus, the crystallinity and the grain orientation of the polysilicon film to be formed later can be controlled by controlling the crystallinity and orientation of the seed layer 24. The grain size of the seed layer 24 can be from 500 to 5000 angstroms. The seed layer 24 can be lattice-matched to a polysilicon layer formed from the amorphous silicon layer 26 in the later annealing process. The seed layer 24 can be composed of cerium oxide ($CeO_2$), calcium fluoride ($CaF_2$), or zirconium oxide ($ZrO_2$).

After the deposition of the amorphous silicon layer 26, a laser annealing process 28, such as an excimer laser annealing process, or a solid-state laser annealing process is performed to irradiate the amorphous silicon layer 26 and induce a crystallization process. The energy of the laser annealing process can be equal to or greater than that needed to cause a complete melting of the silicon layer. The full-melt threshold energy depends upon silicon layer thickness, layer wavelength, laser pulse-width etc. According to some embodiments, the laser annealing process can be performed at an energy of 250 to 500 mJ/cm2. In addition, the laser annealing process can be performed at a plurality time of laser pulses, for example, 2 to 10 times of pulses. In the case of XeCl pulse layer and for a 500 angstroms thick silicon layer, this value is typically in the 280 to 350 mJ/cm2 range.

Ideally, the lattice-matched seed layer 24 will act as a seed material to facilitate the growth of the amorphous silicon layer 26 during the crystallization, such that the amorphous silicon layer 26 will grow from the lattice-matched seed layer 24 and transform into a polysilicon film after the energy level of the laser annealing process surpasses the full-melt threshold and reaches the complete melting of the amorphous silicon layer 26.

Since the crystallinity of the resulting polysilicon film is controlled by the seed layer 24, the variation of laser energy density and film thickness will have reduced effect on the crystallinity of the resulting polysilicon film. By utilizing the seed layer 24 to control the size of the grains, the microcrystallization phenomenon observed in the prior art when the laser energy is greater than the full-melt threshold will not take place.

Additionally, since the grain size of the polysilicon film in the embodiments of the present invention is depended upon the crystallinity of the seed layer 24, uniform silicon grain size can be obtained even at significantly reduced laser shot counts. Hence, some embodiment of the present invention is able to increase throughput and require fewer number of laser annealing equipment for a given production output, and reduces the equipment, facility, and maintenance cost.

Furthermore, the crystallinity and the grain orientation of the resulting polysilicon film can be controlled by manipulating the crystallinity and orientation of the seed layer 24, which will provide users an additional parameter to control the crystallinity of the silicon film. For instance, a highly preferred oriented (111) cerium oxide can be deposited, making it possible to produce a highly preferred oriented (111) silicon film by using this approach.

Figure 3:
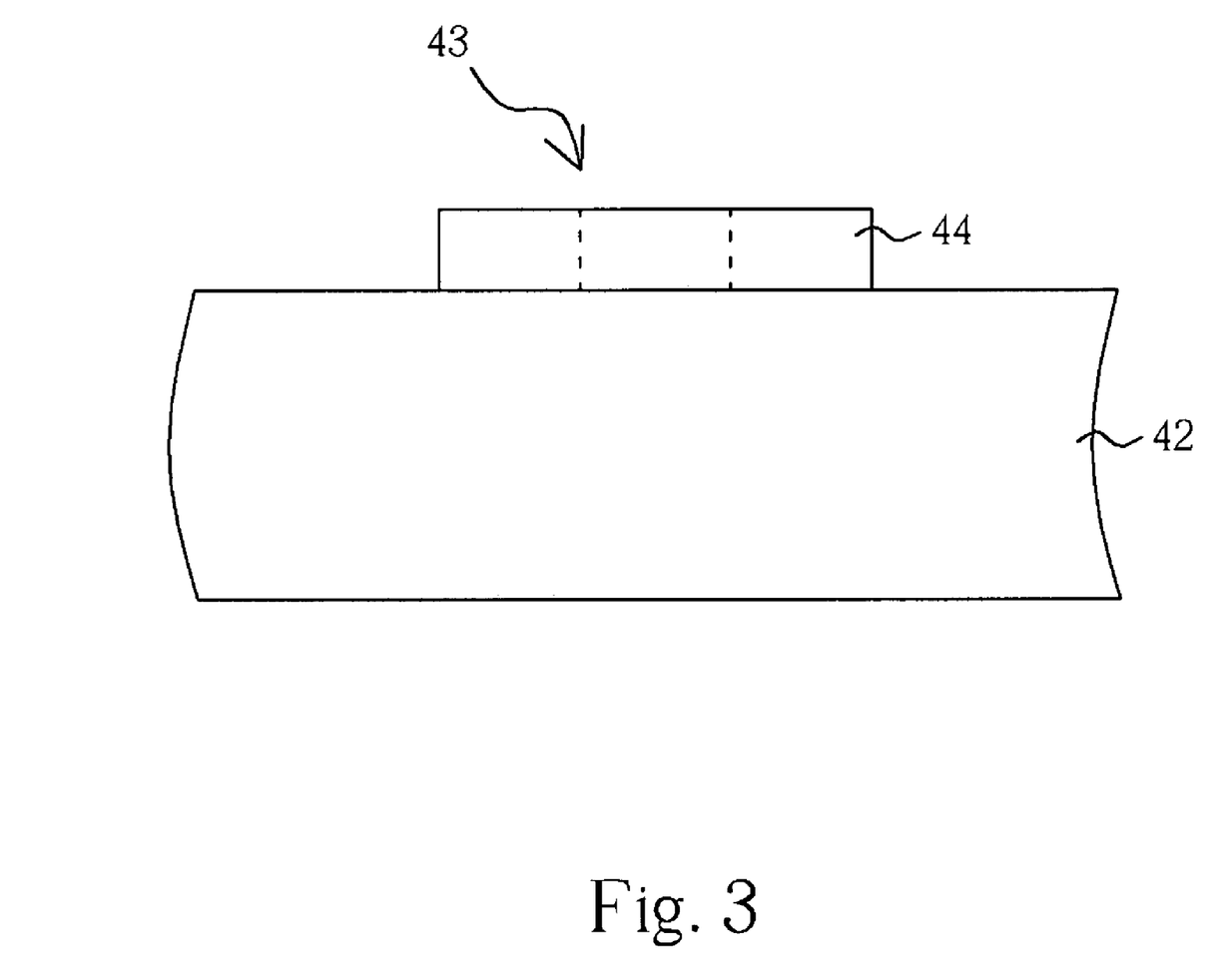
FIG. 3 through FIG. 5 are perspective diagrams showing the means of fabricating a low temperature polysilicon thin film transistor according to an embodiment of the present invention.
Figure 4:
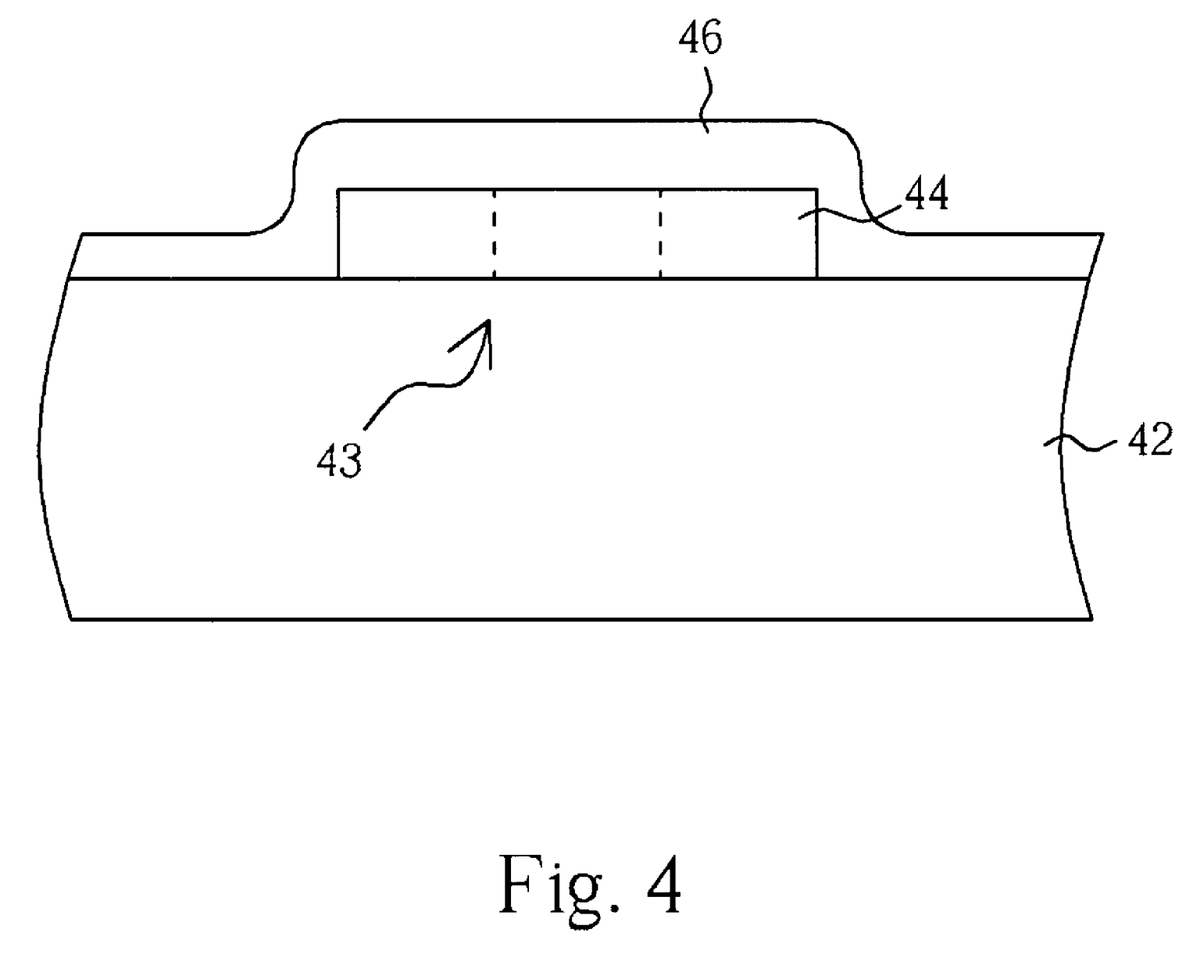
Figure 5:
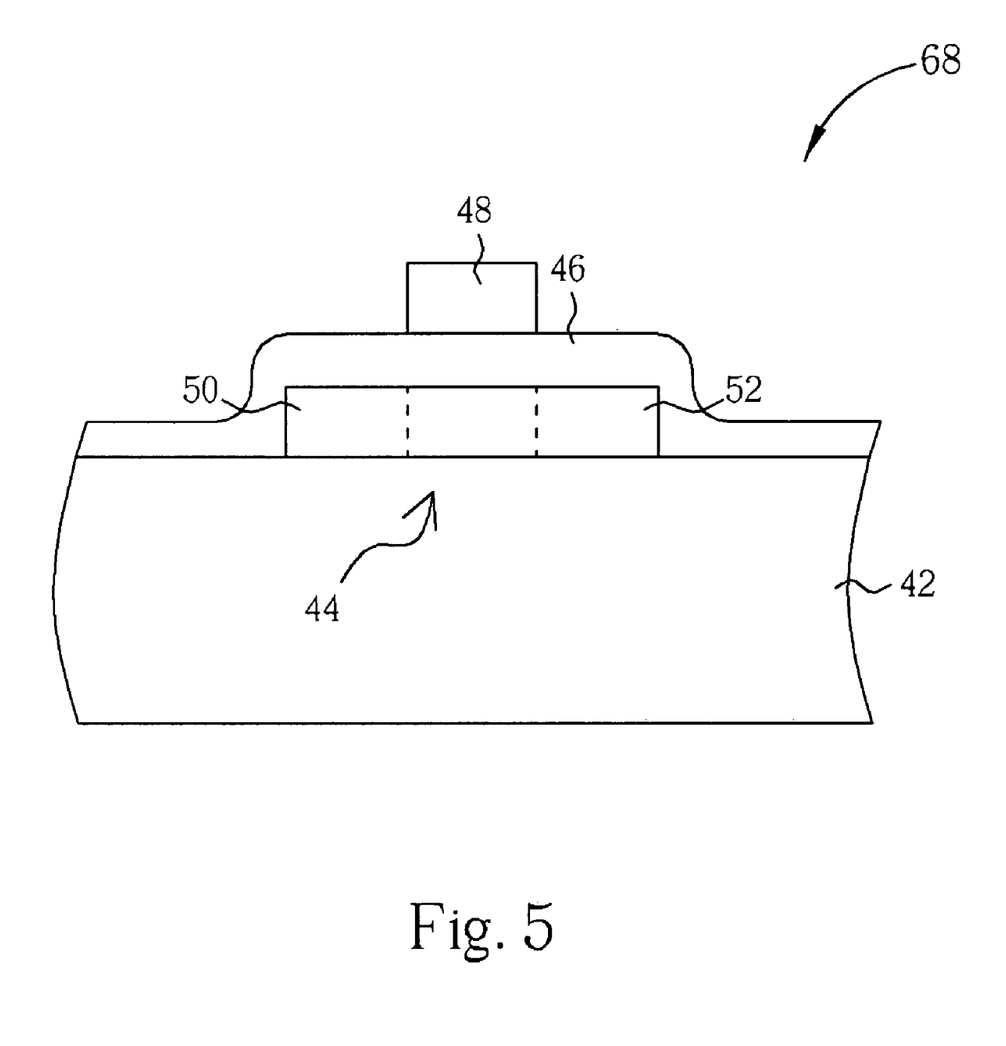

According to another embodiment of the present invention, the resulting polysilicon layer can be further utilized and processed to form a plurality of polysilicon thin film transistors. FIG. 3 through FIG. 5 are perspective diagrams showing the means of fabricating a low temperature polysilicon thin film transistor according to an embodiment of the present invention. As shown in FIG. 3, a substrate 42 having a polysilicon layer 44 thereon is provided, in which the polysilicon layer 44 is fabricated by the process described above. An etching process is performed thereafter to form a plurality of active areas 43 of the polysilicon layer 44. As shown in FIG. 4, a gate insulating layer 46 composed of silicon oxide or silicon nitride is deposited over the surface of the polysilicon layer 44, and a metal layer (not shown) composed of tungsten (W) or chromium (Cr) is formed on the gate insulating layer thereafter. Next, a patterned resist (not shown) is deposited on the metal layer and an etching process, such as a dry etching process is performed by utilizing the patterned resist as a mask to etch portions of the metal layer not covered by the patterned resist for forming a gate 48 on the polysilicon layer 44. As shown in FIG. 5, after removing the patterned resist, an ion implantation process is performed by utilizing the gate 48 as a mask to deposit corresponding dopants into the active areas 43 of the polysilicon layer 44 for forming a source 50 and a drain 52 and complete the fabrication of a low temperature polysilicon thin film transistor 68.

Figure 6:
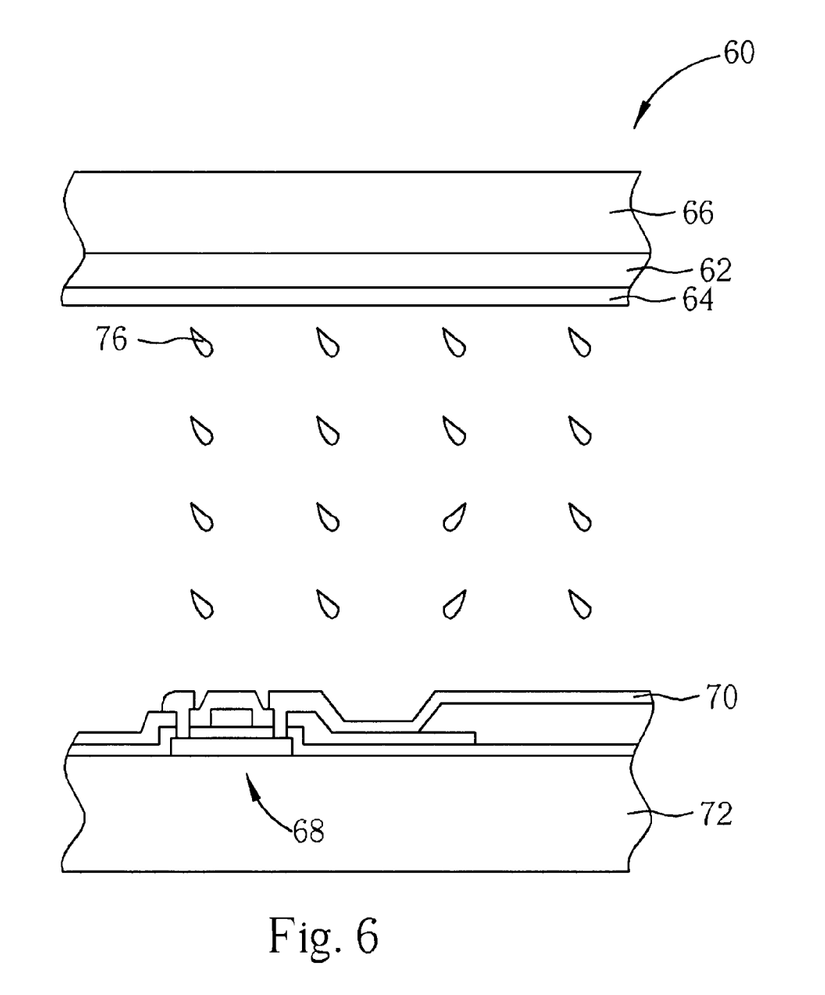
FIG. 6 is a perspective diagram showing a liquid crystal display panel according to an embodiment of the present invention.

According to another embodiment of the present invention, the low temperature polysilicon thin film transistor described above can be further utilized in a display panel, such as a liquid crystal display panel or an organic light emitting diode panel (OLED panel). FIG. 6 is a perspective diagram showing a liquid crystal display panel according to an embodiment of the present invention. As shown in FIG. 6, the liquid crystal display panel 60 includes a color filter 62 and a common electrode 64 disposed on the bottom surface of a top substrate 66, a thin film transistor 68 and a pixel electrode 70 disposed on a bottom substrate 72, and a liquid crystal layer 76 disposed between the top substrate 66 and the bottom substrate 72. The thin film transistor 68 can be fabricated by the process described in the previous embodiment.

Figure 7:
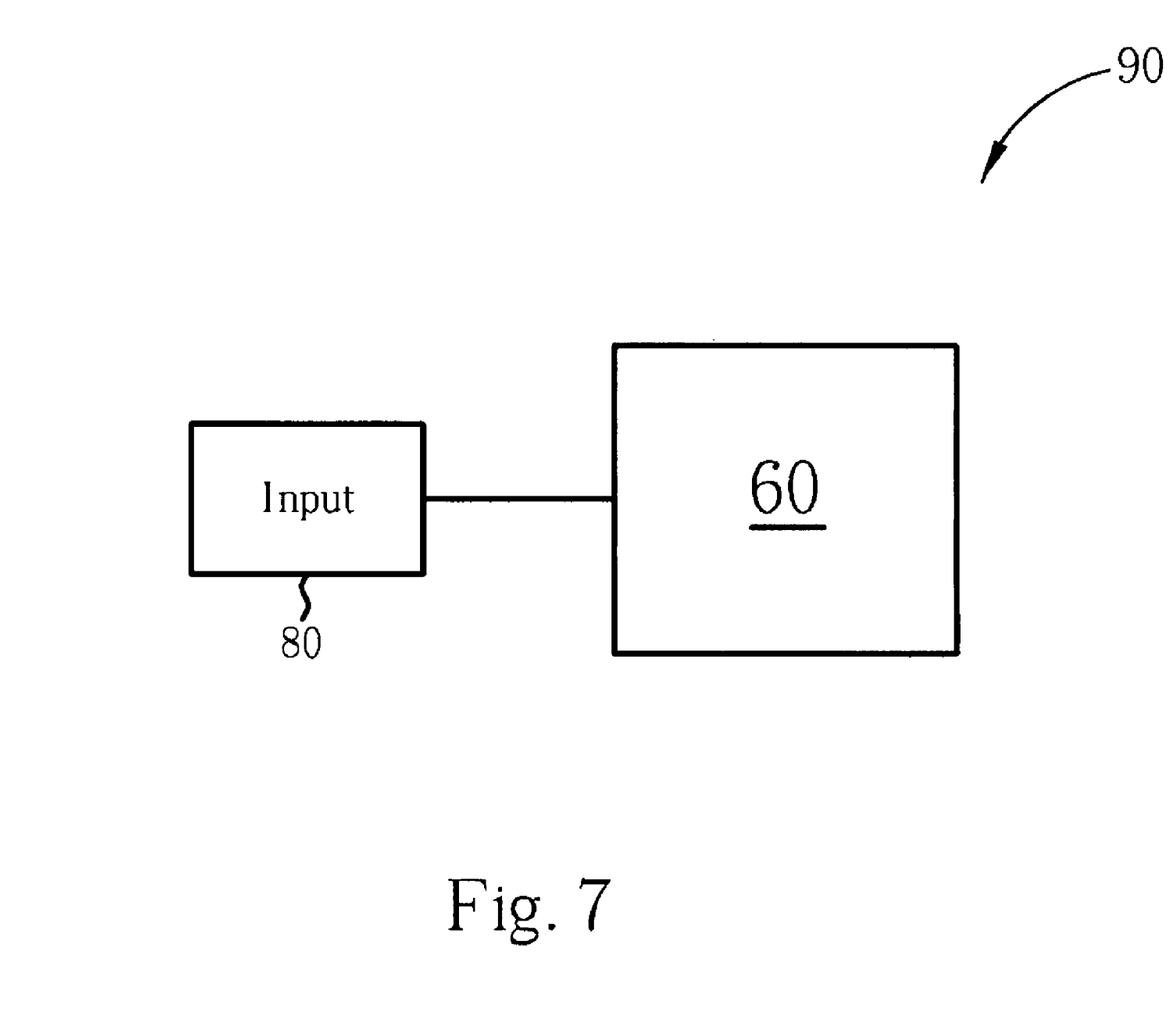
FIG. 7 is a schematic diagram of an electronic device according to an embodiment of the present invention.

Additionally, the liquid crystal display panel 60 can be further incorporated to an electronic device. FIG. 7 schematically shows an electronic device 90 employing the disclosed display panel 60. The electronic device 90 may be a portable device such as a PDA, digital camera, notebook computer, tablet computer, cellular phone, DVD player, or the like. Generally, the electronic device 90 comprises the display panel 60 shown in FIG. 6 and an input unit 80. The input unit 80 is coupled to the display panel 60 and operative to provide input signals (e.g., image signal) to the panel 60, thereby allowing the liquid crystal display panel to display images.

Overall, some embodiment of the present invention places an additional seed layer between the barrier layer and the amorphous silicon layer, in which the seed layer is lattice-matched to the amorphous silicon layer. By utilizing the seed layer, some embodiments of the present invention is able to increase the optimum laser energy range, also referred to as the process window for crystallization of silicon, reduce the number of laser shots required for uniform silicon thereby leading to increased throughput and reduced fabrication cost, and improve the crystallinity of the resulting polysilicon film thereby enhancing the thin film transistor performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a polysilicon film comprising:
    forming a seed layer with a highly preferred orientation on a surface of a substrate, wherein the seed layer comprises cerium oxide ($CeO_2$), calcium fluoride ($CaF_2$), or zirconium oxide ($ZrO_2$);
    forming an amorphous silicon layer over the surface of the seed layer; and
    performing a laser annealing process to transform the amorphous silicon layer into a polysilicon layer according to the highly preferred orientation of the seed layer and at a laser energy equal to or greater than that needed to cause complete melting of the amorphous silicon layer.

2. The method of claim 1, wherein the substrate is a glass substrate.

3. The method of claim 1 further comprising forming a barrier layer between the seed layer and the substrate.

4. The method of claim 1, wherein the formation of the seed layer is achieved by sputtering, atomic layer deposition (ALD), evaporation, or chemical vapor deposition (CVD).

5. The method of claim 1, wherein the formation of the amorphous silicon layer is achieved by chemical vapor deposition.

6. The method of claim 1, wherein the thickness of the seed layer is 500 to 5000 angstroms.

7. The method of claim 1, wherein the seed layer comprises a crystal structure.

8. The method of claim 7, wherein the seed layer is lattice-matched to the polysilicon layer.

9. The method of claim 7, wherein the grain size of the seed layer is from 500 to 5000 angstroms.

10. The method of claim 1, wherein the laser annealing process comprises excimer laser annealing process, or solid-state laser annealing process.

11. The method of claim 1, wherein the laser annealing process is performed at an energy of 250 to 500 mJ/cm2.

12. The method of claim 1, further comprising utilizing a plurality of laser pulses for performing the laser annealing process.

13. The method of claim 12, further comprising utilizing 2 to 10 pulses for performing the laser annealing process.

14. A method of fabricating a thin film transistor, comprising:
    forming a polysilicon layer on a substrate, the substrate comprising an active area, a source, and a drain active layer comprising area;
    forming a gate insulating layer on the polysilicon layer;
    forming a gate layer on the gate insulating layer,
    wherein the polysilicon layer is formed by the following steps:
    forming a seed layer with a highly preferred orientation on a surface of a substrate, wherein the seed layer comprises cerium oxide ($CeO_2$), calcium fluoride ($CaF_2$), or zirconium oxide ($ZrO_2$);
    forming an amorphous layer over the surface of the seed layer; and
    performing a laser annealing process to transform the amorphous silicon layer into a polysilicon layer according to the highly preferred orientation of the seed layer and at a laser energy equal to or greater than that needed to cause complete melting of the amorphous silicon layer.

15. A method of fabricating a display panel, comprising:
    forming a top substrate having a common electrode and a color filter disposed thereon;
    forming a bottom substrate having a pixel electrode disposed thereon;
    forming the thin film transistor on the bottom substrate according to the method as claimed in claim 14; and
    forming a liquid crystal layer disposed between the top substrate and the bottom substrate.

16. A method of fabricating an electronic device, comprising:
    forming the display panel according to the method as claimed in claim 15; and
    forming an input unit coupled to the display panel and operative to provide input to the display panel such that the display panel displays images.

* * * * *